United States Patent
Wong

(10) Patent No.: US 9,525,002 B2
(45) Date of Patent: Dec. 20, 2016

(54) IMAGE SENSOR DEVICE WITH SENSING SURFACE CAVITY AND RELATED METHODS

(71) Applicant: STMICROELECTRONICS PTE LTD, Singapore (SG)

(72) Inventor: Wing Shenq Wong, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 0 days.

(21) Appl. No.: 14/589,210

(22) Filed: Jan. 5, 2015

(65) Prior Publication Data
US 2016/0197113 A1 Jul. 7, 2016

(51) Int. Cl.
*H01L 31/0232* (2014.01)
*H01L 27/146* (2006.01)

(52) U.S. Cl.
CPC ... *H01L 27/14636* (2013.01); *H01L 27/14618* (2013.01); *H01L 27/14625* (2013.01); *H01L 27/14685* (2013.01)

(58) Field of Classification Search
CPC ........... H01L 27/14625; H01L 31/0203; H01L 31/0232; H01L 24/97; H01L 27/14627; G02B 7/021
See application file for complete search history.

(56) References Cited

U.S. PATENT DOCUMENTS

| 6,483,101 | B1 | 11/2002 | Webster |
| 6,995,462 | B2 | 2/2006 | Bolken et al. |
| 7,227,236 | B1 | 6/2007 | Lee et al. |
| 7,288,757 | B2 | 10/2007 | Farnworth et al. |
| 7,494,292 | B2 | 2/2009 | Kong et al. |
| 7,498,556 | B2 | 3/2009 | Yang et al. |
| 7,745,897 | B2 | 6/2010 | Tan et al. |
| 7,880,132 | B2 | 2/2011 | Brodie et al. |
| 7,911,017 | B1 * | 3/2011 | de Guzman ........... G02B 7/021 257/234 |
| 8,193,555 | B2 | 6/2012 | Lin et al. |
| 2006/0097365 | A1 * | 5/2006 | Song .................. H01L 23/3128 257/666 |
| 2007/0064317 | A1 | 3/2007 | Chen et al. |
| 2007/0272827 | A1 | 11/2007 | Heo et al. |
| 2008/0083964 | A1 * | 4/2008 | Fujimoto .......... H01L 27/14618 257/432 |

(Continued)

FOREIGN PATENT DOCUMENTS

EP    1041628 A2    10/2000

*Primary Examiner* — Mohsen Ahmadi
*Assistant Examiner* — Ismail Muse
(74) *Attorney, Agent, or Firm* — Allen, Dyer, Doppelt, Milbrath & Gilchrist, P.A.

(57) ABSTRACT

An image sensor device may include an interconnect layer, an image sensor IC carried by the interconnect layer and having an image sensing surface, and encapsulation material laterally surrounding the image sensor IC and covering an upper surface of the image sensor IC up to the image sensing surface. The image sensor device may include an optical plate having a peripheral lower surface carried by an upper surface of the encapsulation material and aligned with the image sensing surface, the optical plate being spaced above the image sensing surface to define an internal cavity, and a lens assembly coupled to the encapsulation material and aligned with the image sensing surface.

22 Claims, 4 Drawing Sheets

(56) References Cited

U.S. PATENT DOCUMENTS

| | | | |
|---|---|---|---|
| 2008/0083965 A1* | 4/2008 | Ryu | H01L 27/14618 |
| | | | 257/433 |
| 2008/0173792 A1 | 7/2008 | Yang et al. | |
| 2008/0274579 A1 | 11/2008 | Yang et al. | |
| 2008/0297645 A1 | 12/2008 | Lo et al. | |
| 2011/0096219 A1* | 4/2011 | Lee | H01L 27/14618 |
| | | | 348/308 |
| 2011/0115918 A1 | 5/2011 | Webster | |
| 2014/0184809 A1 | 7/2014 | Luan | |
| 2015/0062424 A1* | 3/2015 | Chen | H04N 5/2257 |
| | | | 348/374 |
| 2016/0104737 A1 | 4/2016 | Luan | |

* cited by examiner

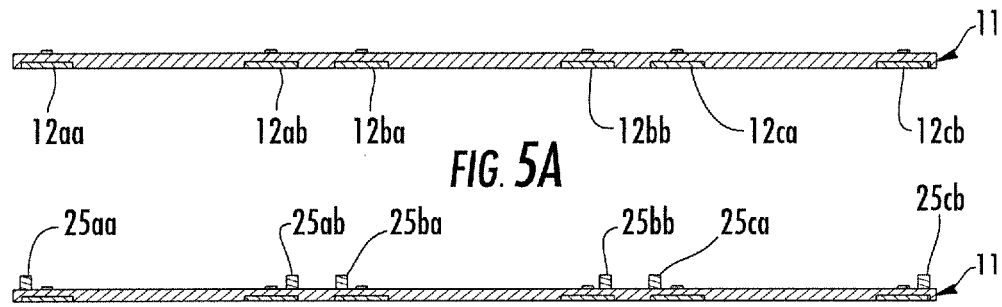
FIG. 5A
FIG. 5B
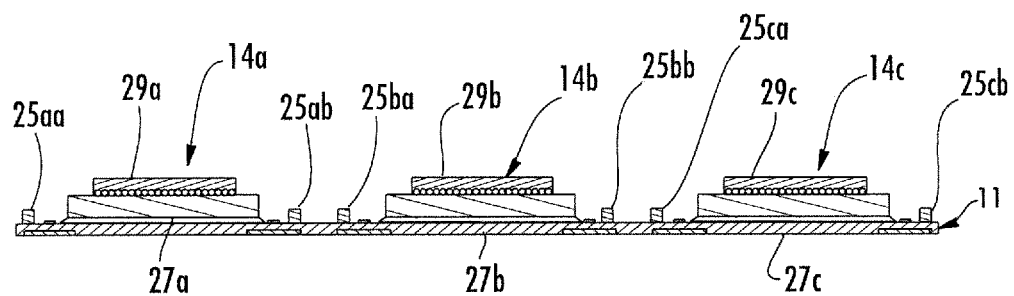
FIG. 5C
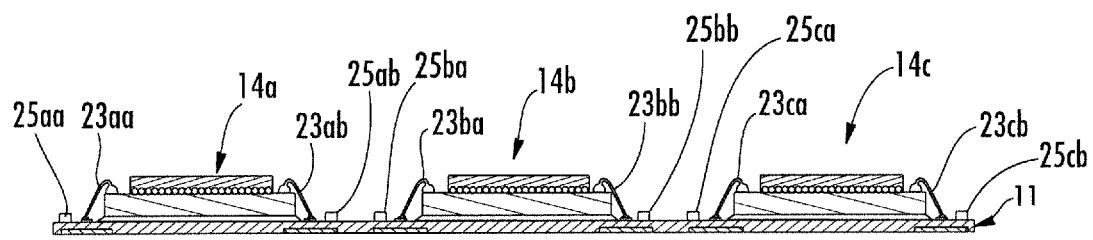
FIG. 5D

IMAGE SENSOR DEVICE WITH SENSING SURFACE CAVITY AND RELATED METHODS

TECHNICAL FIELD

The present disclosure relates to the field of electronic devices, and, more particularly, to image sensors and related methods.

BACKGROUND

Typically, electronic devices include one or more camera modules for providing enhanced media functionality. For example, the typical electronic device may utilize the camera modules for photo capturing and video teleconferencing. In the typical electronic device with multiple camera modules, the primary camera module has a high pixel density and an adjustable focus lens system, while the secondary camera module is front-facing and has a lower pixel density. Also, the secondary camera module may have a fixed focus lens system.

For example, U.S. Pat. No. 7,880,132 to Brodie et al., assigned in part to the present application's assignee, discloses a camera module for a mobile device. The camera module comprises a lens, a housing carrying the lens, and a lens cap over the lens and housing. The camera module includes a barrel mechanism for adjusting the lens. During manufacture of an electronic device including one or more camera modules, there is a desire to manufacture the electronic device as quickly as possible, particularly in mass production runs.

The typical camera module is manufactured in a multi-step process. The first steps include semiconductor processing to provide the image sensor integrated circuit (IC). The next steps include some form of testing for the image sensor IC and packaging. The image sensor IC may be assembled into the camera module, along with a lens and movable barrel if needed. This assembly of the camera module may be performed manually or via machine. For example, in electronic devices that use surface mounted components, a pick-and-place (PNP) machine may assemble the components onto a printed circuit board (PCB).

Referring initially to FIG. 1, a typical image sensor device 100 is now described. The image sensor device 100 includes an interconnect layer 101, a plurality of contacts 102a-102b carried by the interconnect layer, and an image sensor IC 103 over the interconnect layer. The image sensor device 100 includes a bond wire 104 coupled between the image sensor IC 103 and the interconnect layer 101, an optical plate 105 aligned with the image sensor IC, and encapsulation material 106 surrounding the image sensor IC and the transparent plate. The image sensor device 100 includes a lens assembly 108 over the interconnect layer 101, and an electronic component 107 in the encapsulation material 106.

Referring now to FIG. 2, another typical image sensor device 200 is now described. The image sensor device 100 includes an interconnect layer 201, a plurality of ball grid array (BGA) contacts 202a-202l carried by the interconnect layer, an image sensor IC 203 over the interconnect layer, and an adhesive layer 210 between the interconnect layer and the image sensor IC. The image sensor device 200 includes bond wires 204a-204b coupled between the image sensor IC 203 and the interconnect layer 201, an optical plate 205 aligned with the image sensor IC, and encapsulation material 206 completely surrounding the image sensor IC and the transparent plate. The image sensor device 200 includes an electronic component 207a-207b in the encapsulation material 206, and an annular adhesive layer 209 between the image sensor IC 203 and the optical plate 205.

SUMMARY

Generally, an image sensor device may include an interconnect layer, and an image sensor IC carried by the interconnect layer and having an image sensing surface. The image sensor device may comprise encapsulation material laterally surrounding the image sensor IC and covering an upper surface of the image sensor IC up to the image sensing surface, and an optical plate having a peripheral lower surface carried by an upper surface of the encapsulation material and aligned with the image sensing surface. The optical plate may be spaced above the image sensing surface to define an internal cavity. The image sensor device may include a lens assembly coupled to the encapsulation material and aligned with the image sensing surface.

Additionally, the image sensor IC may comprise a plurality of micro lenses on the image sensing surface. In some embodiments, the optical plate may comprise an infrared (IR) filter. In other embodiments, the optical plate may comprise an antireflective plate.

The image sensor IC may comprise a semiconductor substrate defining the image sensing surface, and a plurality of electrically conductive bond pads on the semiconductor substrate. The image sensor device may also include a plurality of bond wires coupled between the plurality of bond pads and the interconnect layer. The interconnect layer may comprise a plurality of electrically conductive traces therein, and a plurality of electrically conductive contacts coupled respectively to the plurality of electrically conductive traces.

Also, the image sensor device may comprise an electronic component in the encapsulation material and being coupled to the interconnect layer. The image sensor device may further comprise an adhesive layer between the encapsulation material and the lens assembly.

Another aspect is directed to a method for making an image sensor device. The method may include positioning an image sensor IC, the image sensor IC being carried by an interconnect layer and having an image sensing surface. The method may include forming encapsulation material laterally surrounding the image sensor IC and covering an upper surface of the image sensor IC up to the image sensing surface, and positioning an optical plate. The optical plate may have a peripheral lower surface carried by an upper surface of the encapsulation material and aligned with the image sensing surface, and may be spaced above the image sensing surface to define an internal cavity. The method may comprise coupling a lens assembly to the encapsulation material and aligned with the image sensing surface.

More specifically, the image sensor IC may include a tape layer covering the image sensing surface. The method may include removing the tape layer to define a recess in the encapsulation material aligned with the image sensing surface

BRIEF DESCRIPTION OF THE DRAWINGS

FIGS. 5A-5H are schematic cross-sectional views of steps in making the image sensor device of FIG. 3.

DETAILED DESCRIPTION

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and prime notation is used to indicate similar elements in alternative embodiments.

Figure 1:
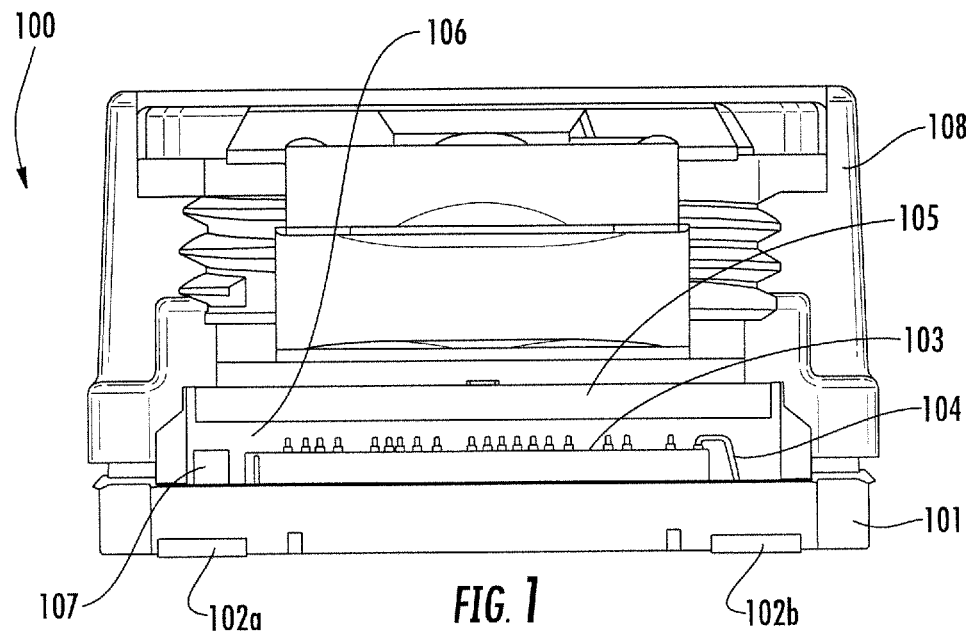
FIGS. 1 and 2 are schematic cross-sectional views of image sensor devices, according to the prior art.
Figure 2:
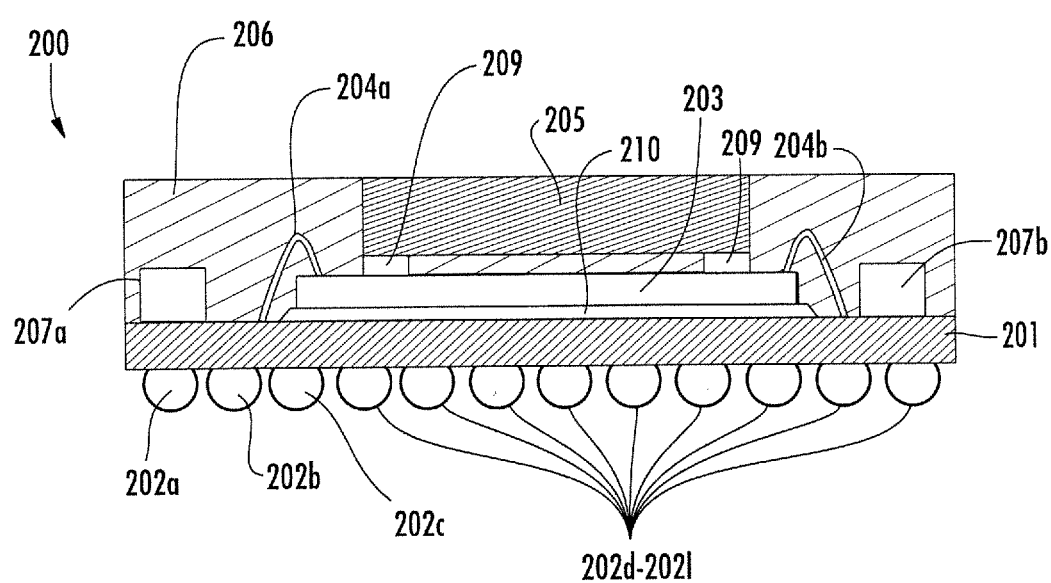
Figure 3:
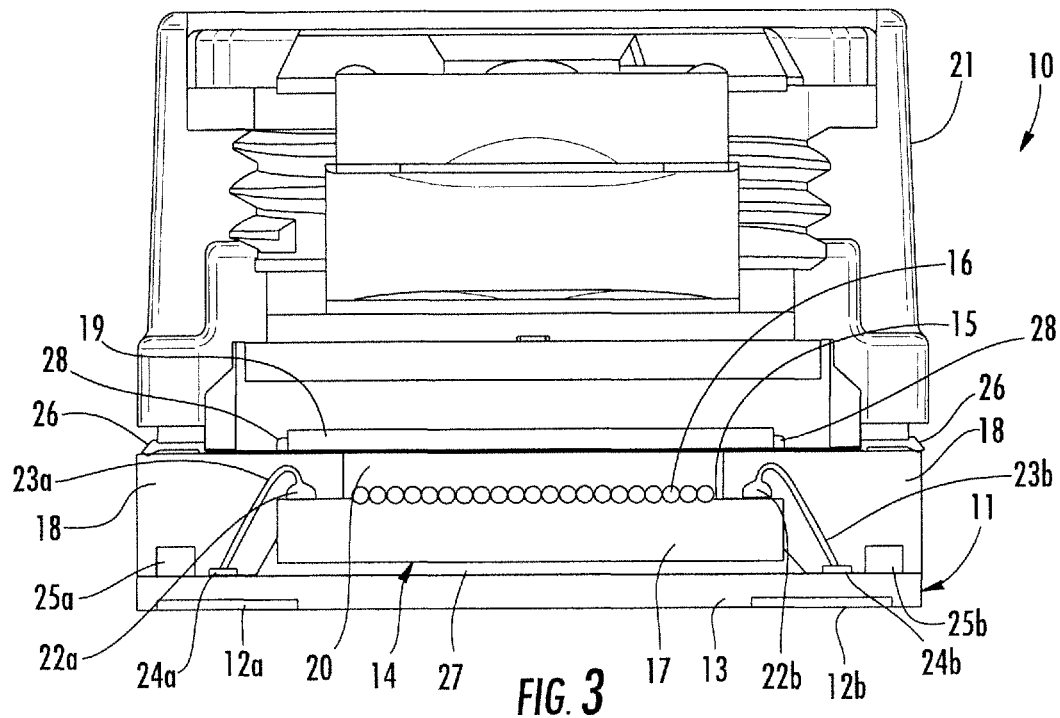
FIG. 3 is a schematic cross-sectional view of an image sensor device, according to the present disclosure.

Referring now to FIG. 3, an image sensor device 10 according to the present disclosure is now described. The image sensor device 10 illustratively includes an interconnect layer 11. The interconnect layer 11 illustratively includes a dielectric layer 13 (e.g. liquid crystal polymer), a plurality of electrically conductive traces 24a-24b (e.g. copper, aluminum) carried by the dielectric layer, and a plurality of electrically conductive contacts 12a-12b (e.g. copper, aluminum) coupled respectively to the plurality of electrically conductive traces.

The image sensor device 10 illustratively includes an image sensor IC 14 (e.g. color image sensor) carried by the interconnect layer 11 and having an image sensing surface 15, and an adhesive layer 27 between the interconnect layer and the image sensor IC. Additionally, the image sensor IC 14 illustratively includes a plurality of micro lenses 16 (the micro lenses filtering desired wavelengths of radiation) on the image sensing surface 15. The image sensor IC 14 illustratively includes a semiconductor substrate 17 (e.g. silicon) defining the image sensing surface 15 on an upper surface thereof, and a plurality of electrically conductive bond pads 22a-22b (e.g. copper, aluminum) on the semiconductor substrate adjacent the image sensing surface. The image sensor device 10 illustratively includes a plurality of bond wires 23a-23b (e.g. copper, aluminum) coupled between the plurality of bond pads 22a-22b and the interconnect layer 11.

The image sensor device 10 includes encapsulation material 18 laterally surrounding the image sensor IC 14 and covering an upper surface of the image sensor IC up to the image sensing surface 15. In the illustrated embodiment, the encapsulation material 18 completely encloses the plurality of bond wires 23a-23b. The encapsulation material 18 may comprise a molding compound, or a dielectric resin, for example. Also, the image sensor device 10 illustratively includes an electronic component 25a-25b (e.g. capacitor or resistor) in the encapsulation material 18 and being coupled to the interconnect layer 11.

The image sensor device 10 includes an optical plate 19 having a peripheral lower surface carried by an upper surface of the encapsulation material 18 and aligned with the image sensing surface 15. The lower surface of the optical plate 19 is coplanar with the upper surface of the encapsulation material 18, thereby providing a stable mounting surface.

The optical plate 19 is spaced above the image sensing surface 15 to define an internal cavity 20. The lateral size of the internal cavity 20 is as small as possible, but usually a small amount greater than the image sensing surface 15. This is due to processing constraints, for example, due to resin bleed underneath the removable tape layer during molding or defections in the removable tape layer from cutting.

The internal cavity 20 is illustratively rectangle-shaped. In some embodiments, the optical plate 19 may comprise an IR filter. In other embodiments, the optical plate 19 may comprise an antireflective plate. The image sensor device 10 illustratively includes an annular adhesive layer 28 surrounding the optical plate 19 and fixing the optical plate to the upper surface of the encapsulation material 18.

The image sensor device 10 illustratively includes a lens assembly 21 coupled to the encapsulation material 18 and aligned with the image sensing surface 15. The image sensor device 10 illustratively includes an adhesive layer 26 between the encapsulation material 18 and the lens assembly 21. The lens assembly 21 may include a barrel housing, a lens carried by the lens housing, and a motor carried by the barrel housing and for actuating/focusing the lens. Some embodiments may alternatively include a fixed focus lens assembly 21.

Another aspect is directed to a method for making an image sensor device 10. The method may include positioning an image sensor IC 14, the image sensor IC being carried by an interconnect layer 11 and having an image sensing surface 15. The method may include forming encapsulation material 18 laterally surrounding the image sensor IC 14 and covering an upper surface of the image sensor IC up to the image sensing surface 15, and positioning an optical plate 19. The optical plate 19 has a peripheral lower surface carried by an upper surface of the encapsulation material 18 and aligned with the image sensing surface 15, and may be spaced above the image sensing surface to define an internal cavity 20. The method may comprise coupling a lens assembly 21 to the encapsulation material 18 and aligned with the image sensing surface 15.

Referring now additionally to FIGS. 5A-5H, an exemplary embodiment of the method for making the image sensor device 10 is now described. At FIG. 5A, the interconnect layer 11 is provided with electrically conductive contacts 12aa-12cb. At FIG. 5B, the electronic components 25aa-25cb are mounted onto the interconnect layer 11, for example, the illustrated surface mount devices. At FIG. 5C, the image sensor ICs 14a-14c are mounted on the interconnect layer 11 via respective adhesive layers 27a-27c. This step also includes a curing (e.g. heat based) process for the adhesive layers 27a-27c.

Each of the image sensor ICs 14a-14c illustratively includes a tape layer 29a-29c covering the respective image sensing surfaces. The tape layers 29a-29c serve as a protective layer for the image sensing surface during the manufacturing process.

The tape layers 29a-29c may be formed on the image sensor ICs 14a-14c, for example, using a screen printing adhesive on the specific area on a wafer level, a wafer coated adhesive and etch to specific pattern (on the wafer level), or a pre-cut tape (next process as PNP). In one embodiment, the image sensor ICs 14a-14c may be prepared using an exemplary process comprising a wafer lamination step, a wafer back grind and polish step, a wafer mounting step, a tape layer attach step, and a wafer singulation step.

Figure 5E:
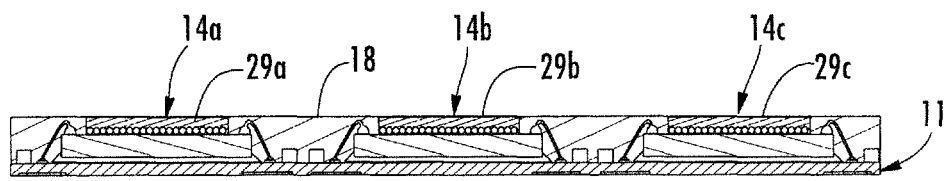
Figure 5F:
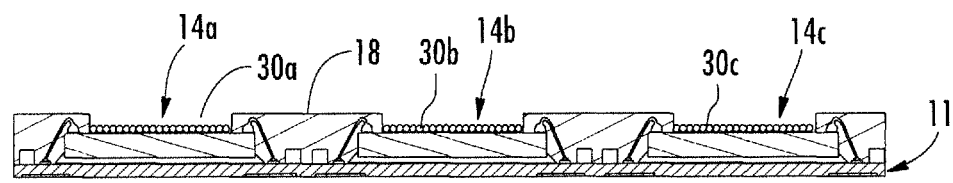

At FIG. 5D, the plurality of bond wires 23aa-23cb is formed for coupling the image sensor ICs 14a-14c to the interconnect layer 11. At FIG. 5E, the encapsulation material 18 is formed to cover the interconnect layer. Because of the tape layers 29a-29c, the image sensing surfaces are protected. Also, when the tape layers 29a-29c are removed in FIG. 5F, rectangular recesses 30a-30c are formed in the encapsulation material 18, the recesses aligning with the image sensing surfaces.

In one embodiment, the tape layers 29a-29c may be removed using an ultraviolet (UV) cure, which will reduce adhesion, and a subsequent baking above glue onset temperature (e.g. 180° C.), which will create a shrinkage effect. The tape layers 29a-29c will shrink and curve up (peeling), and are readily removed by an air gun. In another embodiment, the tape layers 29a-29c may be removed using a UV cure, which will reduce adhesion, and a subsequent lamination of a stronger adhesive material layer onto the tape layers. The removal of the stronger adhesive material layer will also remove the tape layers 29a-29c.

Figure 5G:
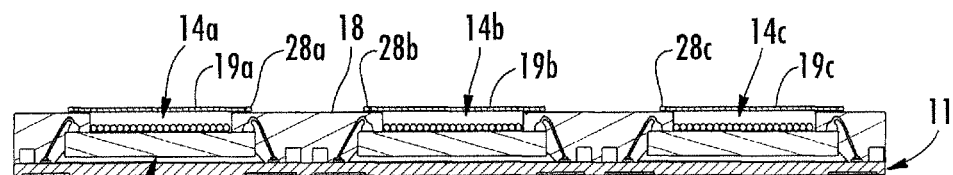
Figure 5H:
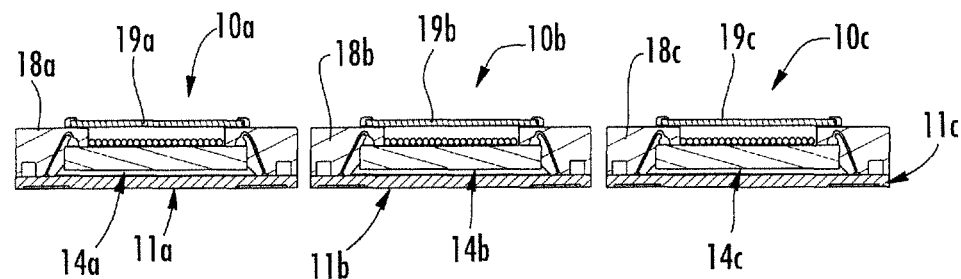

At FIG. 5G, the optical plates 19a-19c are coupled to the upper surface of the encapsulation material 18 using annular adhesive layers 28a-28b, and a curing step. At FIG. 5H, the image sensor devices 10a-10c are singulated using a mechanical saw, for example. Although not depicted, the method may comprise an additional step of attaching the lens assembly 21 to the encapsulation material 18.

The typical image sensor devices 100, 200 may be subject to several issues. For example, the image sensor devices 100, 200 may be subject to de-lamination problems, which are due to coefficient of thermal expansion (CTE) mismatch, i.e. reducing reliability. Also, the image sensor devices 100, 200 may be subject to adhesive material bleeding onto the image sensing surface for GmBGA (i.e. an adhesive dispensing process constraint that prevents dispensing the adhesive material on the die surface near the image sensing surface due to adhesive material surface tension properties causing the adhesive material to bleed and flow onto the image sensing surface), in particular, during dam and fill adhesive optical plate attachment. The image sensor devices 100, 200 may be subject to contamination of the micro lens by pick-up collet during image sensor IC attach, where the design demands that non-pixel array area over total die surface be reduced. The image sensor devices 100, 200 may be subject to "ghosting effect," i.e. light reflection from bond wires where the design demands the imaging surface to be closer to the bond pad 22a-22b.

Advantageously, the image sensor device 10 may provide an approach to these issues and also provide: advanced package structure design, by enabling advanced design rules (where the image sensor silicon design increases aspect ratio of pixel array area versus die size, i.e. mega pixel resolution); and protection of the pixel array from contamination or damage throughout the process (higher mega pixel and small size get more sensitive to the foreign material, which may reduce yield). It should be appreciated that the image sensor device 10 provides an approach to handling increased aspect ratio of pixel array area versus die size ICs, which present difficulties during assembly with PNP devices, due to decreased allowable contact areas.

Also, the image sensor device 10 may provide cavity formation by removable tape instead of a mold cavity design on the pixel array (open air to lens for light receiving) and others area covered by resin, which will provide improved quality and yield. Additionally, the image sensor device 10 may provide, for GmBGA, reduced adhesive material bleed onto the image sensing surface 15, reduced CTE mismatch (due to the silicon-glue-glass interfaces), and reduced de-lamination. For image performance, the image sensor device 10 illustratively includes encapsulation material 18 over the plurality of bonds wires 23a-23b, which can prevent light reflection onto the image sensing surface 15, thereby reducing the ghosting effect.

Moreover, the tape layers 29a-29c may prevent foreign material contamination during the wafer sawing, die attach, and wire bonding processes. The tape layers 29a-29c may eliminate pick-up collect (rubber tips) contamination on the image sensing surface 15. A die attach film (DAF) process may be used, which may avoid the de-lamination issue. Typically, the DAF process may require full force contact of the collet onto die for the even pressure, so as to prevent voids or delamination issue. The method for making the image sensor device 10 allows the collet of the PNP device to apply full pressure during placement without damaging the image sensor ICs 14a-14c. Positively, the image sensor device 10 may be well suited for automobile and mobile phone applications.

Figure 4:
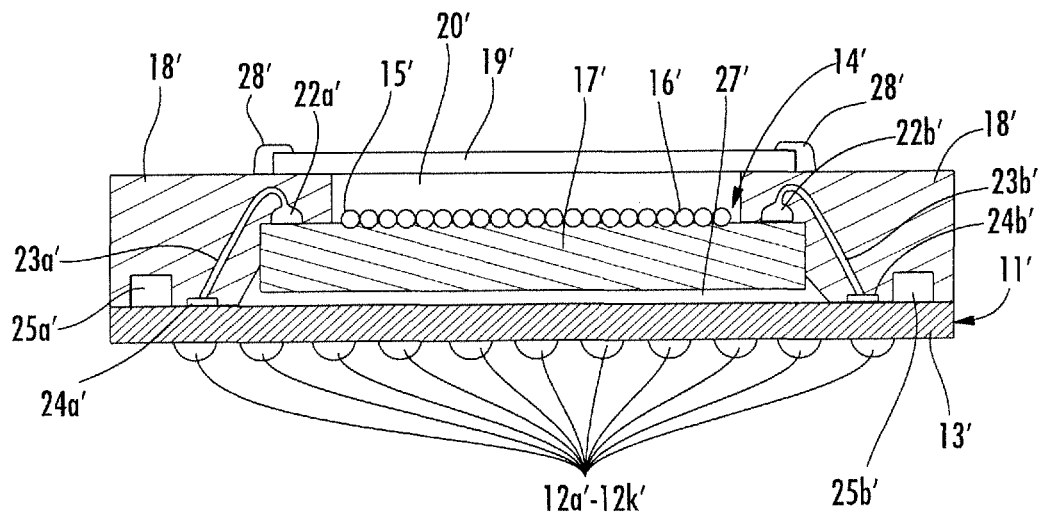
FIG. 4 is a schematic cross-sectional view of another embodiment of the image sensor device, according to the present disclosure.

Referring now additionally to FIG. 4, another embodiment of the image sensor device 10' is now described. In this embodiment of the image sensor device 10', those elements already discussed above with respect to FIG. 3 are given prime notation and most require no further discussion herein. This embodiment differs from the previous embodiment in that this image sensor device 10' has BGA type contacts 12a'-12k' rather than the land grid array contacts of the embodiment of FIG. 3. Also, this image sensor device 10' does not include the lens assembly 21 from FIG. 3.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:
1. An image sensor device comprising:
an interconnect layer;
an image sensor integrated circuit (IC) carried by said interconnect layer and having an image sensing surface;
encapsulation material laterally surrounding said image sensor IC and covering an upper surface of said image sensor IC up to said image sensing surface;
an optical plate having a peripheral lower surface carried by an upper surface of said encapsulation material and aligned with the image sensing surface, said optical plate being spaced above said image sensing surface to define an internal cavity;
an annular adhesive layer contacting lateral sides of said optical plate, surrounding said optical plate, and fixing said optical plate to the upper surface of said encapsulation material; and
a lens assembly coupled to said encapsulation material and aligned with said image sensing surface, the annular adhesive layer being between said lens assembly and the lateral sides of said optical plate.
2. The image sensor device of claim 1 wherein said lens assembly is spaced apart from the lateral sides of said optical plate and said annular adhesive layer.
3. The image sensor device of claim 1 wherein said optical plate comprises an infrared (IR) filter.
4. The image sensor device of claim 1 wherein said optical plate comprises an antireflective plate.
5. The image sensor device of claim 1 wherein said image sensor IC comprises a semiconductor substrate defining said image sensing surface, and a plurality of electrically conductive bond pads on said semiconductor substrate.

6. The image sensor device of claim 5 further comprising a plurality of bond wires coupled between said plurality of bond pads and said interconnect layer.

7. The image sensor device of claim 1 wherein said interconnect layer comprises a plurality of electrically conductive traces therein, and a plurality of electrically conductive contacts coupled respectively to said plurality of electrically conductive traces.

8. The image sensor device of claim 1 further comprising an electronic component in said encapsulation material and being coupled to said interconnect layer.

9. The image sensor device of claim 1 further comprising an adhesive layer between said encapsulation material and said lens assembly.

10. An image sensor device comprising:
an interconnect layer;
an image sensor integrated circuit (IC) carried by said interconnect layer and comprising an image sensing surface, and a plurality of micro lenses on said image sensing surface;
encapsulation material laterally surrounding said image sensor IC and covering an upper surface of said image sensor IC up to said image sensing surface;
an optical plate having a peripheral lower surface carried by an upper surface of said encapsulation material and aligned with the image sensing surface, said optical plate being spaced above said image sensing surface to define an internal cavity;
an annular adhesive layer contacting lateral sides of said optical plate, surrounding said optical plate, and fixing said optical plate to the upper surface of said encapsulation material;
a lens assembly coupled to said encapsulation material and aligned with said image sensing surface, said lens assembly being spaced apart from the lateral sides of said optical plate and said annular adhesive layer, the annular adhesive layer being between said lens assembly and the lateral sides of said optical plate; and
an adhesive layer between said encapsulation material and said lens assembly.

11. The image sensor device of claim 10 wherein said optical plate comprises an infrared (IR) filter.

12. The image sensor device of claim 10 wherein said optical plate comprises an antireflective plate.

13. The image sensor device of claim 10 wherein said image sensor IC comprises a semiconductor substrate defining said image sensing surface, and a plurality of electrically conductive bond pads on said semiconductor substrate.

14. The image sensor device of claim 13 further comprising a plurality of bond wires coupled between said plurality of bond pads and said interconnect layer.

15. The image sensor device of claim 10 wherein said interconnect layer comprises a plurality of electrically conductive traces therein, and a plurality of electrically conductive contacts coupled respectively to said plurality of electrically conductive traces.

16. A method for making an image sensor device comprising:
positioning an image sensor integrated circuit (IC), the image sensor IC being carried by an interconnect layer and having an image sensing surface;
forming encapsulation material laterally surrounding the image sensor IC and covering an upper surface of the image sensor IC up to the image sensing surface;
positioning an optical plate, the optical plate having a peripheral lower surface carried by an upper surface of the encapsulation material and aligned with the image sensing surface, the optical plate being spaced above the image sensing surface to define an internal cavity;
forming an annular adhesive layer contacting lateral sides of the optical plate, surrounding the optical plate, and fixing the optical plate to the upper surface of the encapsulation material; and
coupling a lens assembly to the encapsulation material and aligned with the image sensing surface, the annular adhesive layer being between the lens assembly and the lateral sides of the optical plate.

17. The method of claim 16 wherein the image sensor IC comprises a tape layer covering the image sensing surface; and further comprising removing the tape layer to define a recess in the encapsulation material aligned with the image sensing surface.

18. The method of claim 16 wherein the lens assembly is spaced apart from the lateral sides of the optical plate and the annular adhesive layer.

19. The method of claim 16 wherein the optical plate comprises an infrared (IR) filter.

20. The method of claim 16 wherein the optical plate comprises an antireflective plate.

21. The method of claim 16 wherein the image sensor IC comprises a semiconductor substrate defining the image sensing surface, and a plurality of electrically conductive bond pads on the semiconductor substrate.

22. The method of claim 21 further comprising coupling a plurality of bond wires between the plurality of bond pads and the interconnect layer.

* * * * *